(12) United States Patent
Khan et al.

(10) Patent No.: US 8,692,293 B2
(45) Date of Patent: Apr. 8, 2014

(54) METHOD TO INCREASE BREAKDOWN VOLTAGE OF SEMICONDUCTOR DEVICES

(71) Applicant: University of South Carolina, Columbia, SC (US)

(72) Inventors: M. Asif Khan, Irmo, SC (US); Vinod Adivarahan, Columbia, SC (US); Qhalid Fareed, Richardson, TX (US); Grigory Simin, Columbia, SC (US); Naveen Tipimeni, Plano, TX (US)

(73) Assignee: University of South Carolina, Columbia, SC (US)

( * ) Notice: Subject to any disclaimer, the term of this patent is extended or adjusted under 35 U.S.C. 154(b) by 0 days.

(21) Appl. No.: 13/668,564

(22) Filed: Nov. 5, 2012

(65) Prior Publication Data
US 2013/0056796 A1 Mar. 7, 2013

Related U.S. Application Data

(62) Division of application No. 12/061,358, filed on Apr. 2, 2008, now Pat. No. 8,318,562.

(60) Provisional application No. 60/921,418, filed on Apr. 2, 2007.

(51) Int. Cl.
*H01L 29/66* (2006.01)

(52) U.S. Cl.
USPC .................. 257/194; 257/E21.268; 438/285

(58) Field of Classification Search
None
See application file for complete search history.

(56) References Cited

U.S. PATENT DOCUMENTS

| | | | |
|---|---|---|---|
| 5,192,987 A | 3/1993 | Khan et al. | |
| 5,726,529 A | 3/1998 | Dean et al. | |
| 6,316,793 B1 | 11/2001 | Sheppard et al. | |
| 6,392,297 B2 | 5/2002 | Seto | |
| 6,528,366 B1 | 3/2003 | Tu et al. | |
| 6,690,042 B2 | 2/2004 | Khan et al. | |
| 6,764,888 B2 | 7/2004 | Khan et al. | |
| 6,998,322 B2 | 2/2006 | Das et al. | |
| 7,141,859 B2 | 11/2006 | DeBoer et al. | |
| 7,199,061 B2 | 4/2007 | Choi et al. | |
| 7,304,340 B2 | 12/2007 | Ogura et al. | |
| 2001/0017370 A1 | 8/2001 | Sheppard et al. | |
| 2005/0110042 A1* | 5/2005 | Saito et al. | 257/192 |
| 2006/0043415 A1 | 3/2006 | Okamoto et al. | |
| 2006/0081897 A1 | 4/2006 | Yoshida | |
| 2006/0273347 A1* | 12/2006 | Hikita et al. | 257/192 |
| 2013/0017689 A1 | 1/2013 | Khan et al. | |

FOREIGN PATENT DOCUMENTS

WO WO 2008/067537 6/2008
WO WO 2009/002365 12/2008

OTHER PUBLICATIONS

Khan et al. "AlGaN/GaN metal-oxide-semiconductor heterostructure field-effect transistors on SiC substrates", Applied Physics Letters vol. 77, No. 9, Aug. 28, 2000, pp. 1339-1341.
Gaska et al. "High Temperature Performance of AlGaN/GaN HFET's on SiC substrates," IEEE Electron Device Letters, vol. 18, No. 10, Oct. 1997.
Ping et al. "DC and Microwave Performance of High Current AlGaN/GaN Heterostructure Field Effect Transistors Grown on P-Type SiC substrates," IEEE Electron Device Letters, vol. 19, No. 2, Feb. 1998.
Green et al., "The Effect of Surface Passivation on the Microwave Characteristics of Undoped AlGaN/GaN HEMT's"; IEEE Electron Device Letters, vol. 21, No. 6, Jun. 2000.

* cited by examiner

*Primary Examiner* — Sonya D McCall Shepard
(74) *Attorney, Agent, or Firm* — Dority & Manning, P.A.

(57) ABSTRACT

Methods of achieving high breakdown voltages in semiconductor devices by suppressing the surface flashover using high dielectric strength insulating encapsulation material are generally described. In one embodiment of the present invention, surface flashover in AlGaN/GaN heterostructure field-effect transistors (HFETs) is suppressed by using high dielectric strength insulating encapsulation material. Surface flashover in as-fabricated III-Nitride based HFETs limits the operating voltages at levels well below the breakdown voltages of GaN.

10 Claims, 7 Drawing Sheets

Device Side View    Device Top View

METHOD TO INCREASE BREAKDOWN VOLTAGE OF SEMICONDUCTOR DEVICES

PRIORITY INFORMATION

The present application claims priority to and is a divisional application of U.S. patent application Ser. No. 12/061,358 titled "Novel Method to Increase Breakdown Voltage of Semiconductor Devices" of Khan, et al. filed on Apr. 2, 2008, and claims priority to U.S. Provisional Patent Application No. 60/921,418 filed on Apr. 2, 2007, naming Asif Khan, Grigory Simin, Naveen Tipirneni, and Vinod Adivarahan as inventors, the disclosures of which are incorporated by reference herein.

GOVERNMENT SUPPORT CLAUSE

The present invention was developed with funding from the Missile Defense Agency under grant HQ0006-06-2-004. The government retains certain rights in the invention.

BACKGROUND

AlGaN/GaN based Hetero structure Field Effect Transistors (HFETs) show a tremendous promise as switching elements for power electronic applications. The key requirements for high-power switches include high breakdown voltage ($V_{BR}$), minimum conduction and switching losses and the highest switching frequency to cope with the modern trends in power converter design and allow for monolithically integrated power converter technology. The most important physical device dimension which governs the breakdown voltage in AlGaN/GaN HFETs is the gate-drain spacing $L_{GD}$ where most of the voltage drops in the pinch-off device condition. The challenge of achieving high breakdown voltage $V_{BR}$ with a minimum on-resistance $R_{ON}$ translates into an optimal field profiling in the gate-drain region so that it is able to sustain the highest possible voltage at the lowest $L_{GD}$ value.

An ideal switch will block infinite voltage when OFF and pass infinite current when ON with no voltage drop across it (or in other words the switch has zero resistance when ON and infinite resistance when OFF) and at the same time be capable of switching at a frequency of infinity. As is evident from its definition, an ideal switch performance can never be achieved by a practical power semiconductor switch. However, the aim of the power semiconductor industry have been to achieve a device which has as low a resistance as possible when in ON state called "ON-resistance" ($R_{ON}$) of the device for a given maximum voltage it can block in OFF state known as "breakdown voltage" ($V_{BR}$) of the device. Keeping the $V_{BR}/R_{ON}$ ratio as high as possible, a maximum device current in ON state known as "$I_{max}$" is tried to be achieved from as small an area "A" as possible of the device. A smaller area of the device has a smaller associated capacitance and hence results in device which can switch at higher frequency "f". As all the above mentioned power device parameters like $V_{BR}$, $R_{ON}$, $I_{max}$, A, f are important, it becomes difficult to quantitatively compare two power devices in terms of their performance as a switch if all the power device parameters are considered. To overcome this problem and fairly but quantitatively compare two power devices, a power device figure merit "$V_{BR}/(R_{ON} \cdot A)$" is defined where in the device with the higher value of figure of merit can be considered a better device than a device with lower value of figure of merit.

In the past, reports on the breakdown voltage of as-fabricated AlGaN/GaN HFETs show that the $V_{BR}$ increases with $L_{GD}$ curve up to $L_{GD} \approx 10$ µm, beyond which $V_{BR}$ saturates at around 400-450V. Single or multiple field plates (overlapping gate) have been implemented to increase the breakdown voltage. The HFETs with single field plate gate structure show a saturation breakdown voltage of 570V at $L_{GD}$=13 µm, The HFET with multiple field plates demonstrates the breakdown voltage of 900V for a device with $L_{GD}$=24 µm. The mechanism of the $V_{BR}$ increase in the field-plated devices is believed to be the electric field spike reduction at the drain side edge of the gate.

The present inventors have discovered that in HFET devices, either with or without the field plates, the breakdown voltage is limited by a surface flashover that occurs in the air regions adjacent to the gate-drain area, and is not due to the breakdown of the In-Nitride material itself. Suppression of this parasitic air breakdown by immersing the devices in a high dielectric strength liquid material like Flourinert® (3M Company, St. Paul, Minn.) results in linear $V_{BR}$-$L_{GD}$ dependence reaching breakdown voltages as high as 1600 V at $L_{GD}$=20 µm. Similar linear $V_{BR}$-$L_{GD}$ curves with parasitic air-breakdown suppression have also been demonstrated on AlGaN/GaN HFETs with integrated slant field plates achieving 1900V at $L_{GD}$=20 µm. The method of suppressing the surface flashover in the air by immersing in Fluorinert® clearly demonstrates the feasibility of achieving very high breakdown voltages in AlGaN/GaN HFETs. However, such method can hardly be considered as a practical way of fabricating devices for high-voltage power converters.

Hence, a need exists to find an alternative way to suppress the surface flashover without the need of immersing the devices in the liquid.

SUMMARY

Objects and advantages of the invention will be set forth in part in the following description, or may be obvious from the description, or may be learned through practice of the invention.

The present invention is a novel method of achieving high breakdown voltages in semiconductor devices by suppressing the surface flashover using high dielectric strength insulating encapsulation material. In one embodiment of the present invention, surface flashover in AlGaN/GaN heterostructure field-effect transistors (HFETs) is suppressed by using high dielectric strength insulating encapsulation material. Surface flashover in as-fabricated III-Nitride based HFETs limits the operating voltages at levels well below the breakdown voltages of GaN. This premature gate-drain breakdown can be suppressed by immersing devices in high dielectric strength liquids (e.g. Fluorinert®); however such a technique is not practical.

However, the present inventors have discovered that AlGaN/GaN HFETs encapsulated with digital dielectric deposited (DDD) or digital oxide deposited (DOD) high dielectric strength insulating encapsulation material films demonstrate the breakdown voltage of about 900 V, very similar to that of devices immersed in the Fluorinert® liquid. Simultaneously, low dynamic ON resistance (i.e. resistance of the switch in ON state or conducting state) of about 2.43 mΩ·cm² is achieved, making the developed AlGaN/GaN HFETs, or any fabricated semiconductor device, practical high voltage high power switches for power electronic applications.

Other features and aspects of the present invention are discussed in greater detail below.

BRIEF DESCRIPTION OF FIGURES

A full and enabling disclosure of the present invention, including the best mode thereof to one skilled in the art, is set forth more particularly in the remainder of the specification, which includes reference to the accompanying figures, in which.

DETAILED DESCRIPTION

Figure 1:
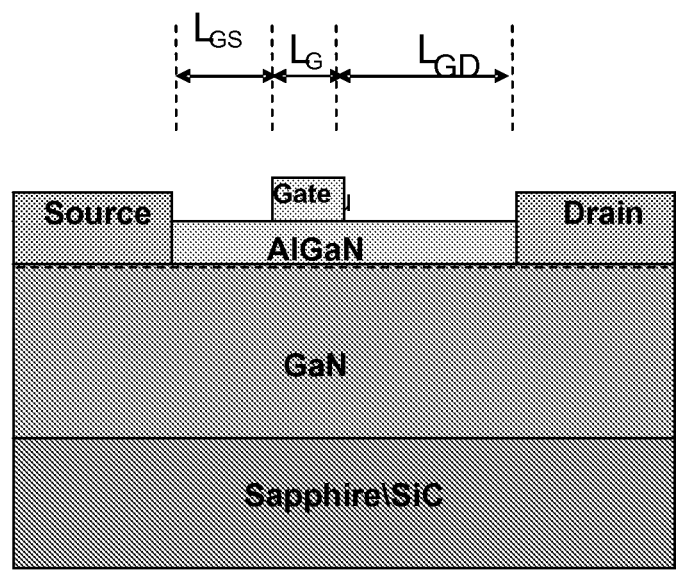
FIG. 1 shows a schematic of an AlGaN/GaN HFET from a side view.

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

Generally speaking, the present invention is directed to a method of fabricating semiconductor devices wherein some or all of the metal electrodes are encapsulated with high strength insulating dielectric materials to prevent premature breakdown of air or other media around the electrodes. The present invention is also generally directed to the semiconductor devices produced by this method.

I. Devices

Any suitable semiconductor device can be encapsulated according to the present invention. Suitable semiconductor devices include, but are not limited to, transistors (e.g., heterostructure field-effect transistors, bipolar transistors, insulated gate bipolar transistors, etc.); MOSFETs (e.g., lateral diffused or lateral doubled-diffused MOSFETs), diodes (e.g., avalanche photodiodes or other types of semiconductor photodetector), thyristors, and the like.

For example, in one particular embodiment, the methods of the present invention can be utilized to form a field effect transistor (FET), and are particular suited for forming high electron mobility transistors (HEMT). A HEMT is a field effect transistor with a junction between two materials with different band gaps (i.e. a heterojunction) as the channel instead of an n-doped region, thus HEMT structures are sometimes referred to as heterostructure field effect transistors (HFET).

The HEMT is a transistor which has a heterojunction formed between two semiconductor materials of different bandgaps. Current in such a device is confined to a very narrow channel at the junction, such current being known as a 2DEG (two dimensional electron gas). GaN/AlGaN based HEMTs grown on a buffer and a substrate were disclosed in U.S. Pat. No. 5,192,987 of Khan et al., which is incorporated by reference herein. The general structure of these FET and HFET devices are known in the art. As such, the following description is directed to one embodiment of a HFET device; however, one of ordinary skill in the art would be able to use the following methods to form any suitable FET device.

The device can be made out of a high breakdown strength material, including but not limited to silicon carbide, group III nitride materials, diamond, or any composite materials comprising any of these materials.

The present invention is particularly well suited for use in nitride-based devices, such as group III-nitride based devices. Although the present invention is not specifically limited to group III-nitride based devices, the following discussion focuses on group III-nitride based devices due to their particular compatibility with the present invention. "Group III nitride" refers to those semiconducting compounds formed between elements in Group III of the periodic table and nitrogen. More preferably the Group III element is selected from the group consisting of aluminum (Al), gallium (Ga), and indium (In). Ternary and quaternary compounds (e.g., AlGaN, InGaN, AlInN and AlInGaN) are particularly preferred. As is well understood in the art, the Group III elements can combine with nitrogen to form binary compounds (e.g., GaN, AlN and InN), ternary compounds (e.g., AlGaN, AlInN, and GaInN), and quaternary compounds (i.e., AlInGaN).

The semiconductor device can include a group III nitride epilayer composed of any combination of group III elements (e.g., Al, In, and Ga) and nitride, on a substrate In one particular embodiment, the group III-nitride epilayer can be represented by the formula $Al_xIn_yGa_{1-x-y}N$, wherein $0 \leq x \leq 1$, $0 \leq y \leq 1$ and $0 \leq x+y \leq 1$. In employing growth techniques to grow the group III nitride epilayer, the precursor sources typically include a metal-organic source (e.g., trimethyl aluminum, trimethyl gallium, triethyl gallium, trimethyl indium), a nitrogen source (e.g., ammonia), a carrier gas (e.g., hydrogen and/or nitrogen), and an optionally doping source (e.g., slime, disilane, biscyclopentadienyl magnesium, etc.). Of course, other materials can be utilized to grow the group III nitride epilayer, and the present invention is not intended to be limited by the above listed materials. For example, another type of a metal-organic source and/or a nitrogen source can be utilized to grow the group III nitride epilayer.

In one embodiment, the semiconductor layers can be grown according to "metalorganic-hydride vapor phase epitaxy" (MOHVPE), as described in International Patent Application No. PCT/US 2007/086096 filed on Nov. 30, 2007 entitled "Method and Apparatus For Growth Of III-Nitride Semiconductor Epitaxial Layers", which is incorporated by reference herein. In this method, the advantages of the well known MOCVD, pulsed atomic layer epitaxy (PALE), and HVPE techniques are combined, while minimizing the disadvantages.

In one particular embodiment, the semiconductor device formed has a planar or lateral geometry and two or more electrodes. For example, planar/lateral geometry GaN Field Effect Transistors which uses the two-dimensional electron gas (2DEG) (above $1 \times 10^{13}$ cm$^{-2}$) formed at the hetero-interface of AlGaN/GaN as the channel can be used according to one embodiment of the present invention. These devices are known as AlGaN/GaN Heterostructure Field Effect Transistors (HFET). The principle of operation of AlGaN/GaN HFET is very similar to an AlGaAs/GaAs HFET, which can also be used according to another embodiment of the present invention.

Figure 2:
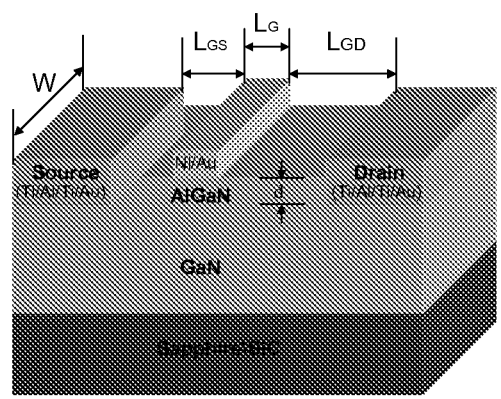
FIG. 2 is a perspective view of the HFET device shown in FIG. 1.
Figure 3A:
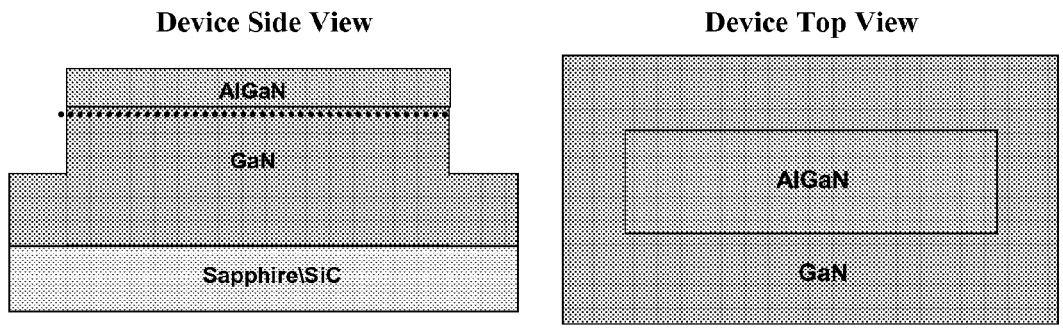
FIG. 3a: MESA formation by $Cl_2/BCl_3/Ar$ RIE etching
Figure 3B:
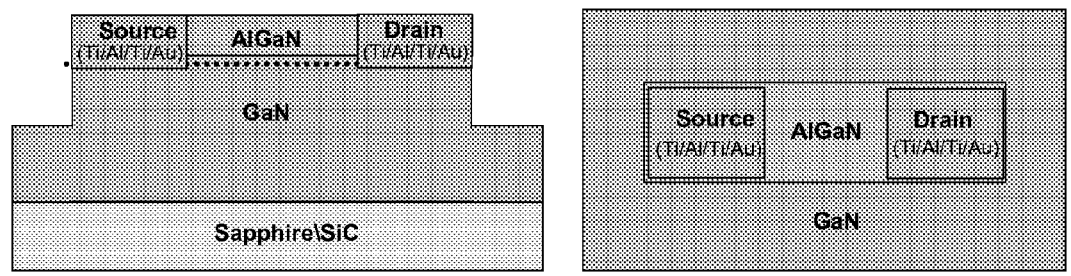
FIG. 3b: Ohmic contact formation by Ti/Al/Ti/Au deposition, lift-off and RTA anneal
Figure 3C:
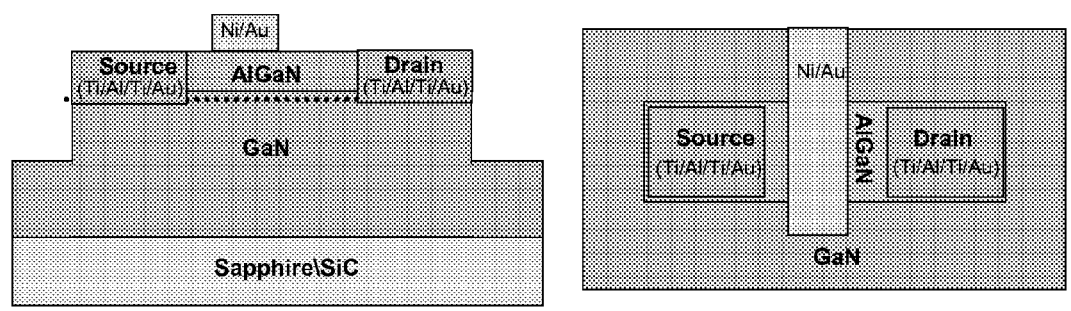
FIG. 3c: Gate formation by Ni/Au deposition and lift-off
Figure 3D:
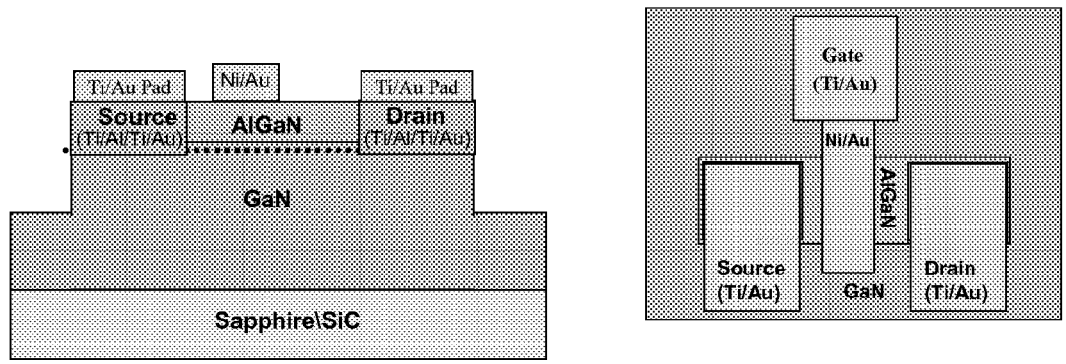
FIG. 3d: Gate, source and drain probe pads formation by Ti/Au deposition and lift-off

Referring to the exemplary AlGaN/GaN HFET shown in FIG. 1, the AlGaN/GaN HFET, like any other lateral transistor, has three terminals where in the source and drain are connected to each other with a thin sheet of electrons called (2DEG) formed at AlGaN/GaN in ON state when there is no voltage or zero voltage on the gate. To close the device or turn it OFF a negative voltage is applied to the gate terminal which pushes the thin sheet of 2D electrons away from the AlGaN/GaN interface or out of the triangular quantum well formed at the AlGaN/GaN interface forming a depletion mode transistor. FIG. 2 is a perspective view of the HEFT device shown in FIG. 1. A device with a relatively small source to drain distance is preferably, since it will yield the lowest ON-resistance and maximum current. FIG. 2 shows an exemplary AlGaN/GaN HFET device schematic to visualize the different device geometries and materials involved in its design. The ON-resistance $R_{ON}$ of AlGaN/GaN HFET (at zero gate bias) can be simply calculated as $$R_{ON} = 2R_C + \rho_{sheet} * (L_{GS} + L_G + L_{GD})/W$$

Where $R_C$ is contact resistance in $\Omega$, $\rho_{sheet}$ is the 2DEG sheet resistance in $\Omega/cm^2$, the device dimensions gate-source distance $L_{GS}$, gate-drain distance $L_{GD}$, gate length $L_G$ and device width W are defined in FIG. 2.

Following the equation given above, for a given $R_C$ governed by the device process details and $\rho_{sheet}$ fixed by the AlGaN/GaN structure, a device with smallest source to drain distance will give the lowest ON-resistance. Hence, AlGaN/GaN HFET with as small a source-drain distance is a particularly preferred designed to achieve as high a breakdown voltage to have the lowest possible ON-resistance power switching devices.

The most important physical device dimension which governs the breakdown voltage in AlGaN/GaN HFETs is the gate-drain spacing $L_{GD}$ where most of the voltage drops in the pinch-off device condition. For an ideal case, in the HFET pinch-off channel condition the depletion region should extend in to the $L_{GD}$ region with increasing drain voltage supporting more voltage before breakdown and thus the breakdown voltage of HFETs should increase linearly with the $L_{GD}$ spacing. However, the gate-source distance has no effect on the breakdown voltage of the AlGaN/GaN HFET device. Hence, the $L_{GS}$ is preferably as small as possible to achieve the lowest ON-resistance and highest current while designing AlGaN/GaN HFET for a particular breakdown voltage $V_{BR}$. To improve the breakdown further and have the highest possible breakdown voltage for the overlapping field plate design, multiple field plates can be used.

II. Encapsulation

In order to suppress surface flashover by inhibiting premature breakdown of air or other media around the electrodes located on a semiconductor device (such as the HFET shown in FIG. 1), an encapsulation material (e.g., high strength insulating dielectric materials) is coated on the semiconductor device.

In one of the embodiment of invention, any suitable encapsulation material that is a high strength insulating dielectric material can be utilized to coat the semiconductor device. Different encapsulation materials include, but are not limited to, any organic or inorganic, ceramic or polymer material. For example, encapsulation materials such as silicon dioxide, silicon nitride, benzocyclobutene (BCB), aluminium nitride (AlN), aluminum galium nitride (AlGaN), galium nitride (GaN), boron nitride (BN), silicon carbide (SiC), diamond, aluminum oxide ($Al_2O_3$), magnesium oxide (MgO), hafnium oxide (HfO), zirconium oxide ($ZrO_2$), scandium oxide ($Sc_2O_3$), those polymers sold under the trade name Teflon® by the DuPont Company (e.g., polytetrafluoroethylene, perfluoroalkoxy, fluorinated ethylene propylene), polystyrene, or the material sold under the trade name Bakelite® by Bakelite AG (Germany) (e.g., material based on the thermosetting phenol formaldehyde resin, polyoxybenzylmethylenglycolanhydride) can be used since the present inventors have discovered that high dielectric strength insulating films can be successfully used to suppress surface flashover.

The encapsulating layer can be deposited on the semiconductor device according to conventional methods. For example, chemical vapor deposition (CVD), hydride vapor phase epitaxy, plasma enhanced chemical vapor deposition, sputtering, thermal evaporation, spin coating, chemical bath deposition, electron beam evaporation can be used to deposit the encapsulation layer.

In another embodiment, the encapsulating layer can be applied to the semiconductor device utilizing the digital dioxide deposition (DDD) method described in U.S. patent application Ser. No. 11/800,712 filed on May 7, 2007 titled "Digital Oxide Deposition of $SiO_2$ Layers on Wafers", which is incorporated by reference herein. In this process, silicon and oxygen precursor sources are alternatively supplied to the PECVD growth chamber. Control over the composition and thickness of the encapsulating layer can be selectively controlled according to this method.

No matter the method utilized to grow or apply the encapsulation material on the semiconductor device, the high dielectric strength insulating encapsulation material has a thickness sufficient to suppress surface flashover, thus increasing the voltage breakdown for the device. The thickness of the high dielectric strength insulating encapsulation material required to suppress the surface flashover can depend on the encapsulation materials. However, in most embodiments, the thickness will be at least about 0.1 micrometers (μm), such as from about 0.3 μm to about 10 μm. For example, when the encapsulation material is constructed of $SiO_2$, the thickness can be preferably at least 0.1 μm, such as from about 0.2 μm to about 0.5 μm. When constructed of BCB, the thickness of the encapsulation material can preferably be from about 500 Å to about 10 μm.

The high dielectric strength insulating encapsulation material is at least applied over the area between the gate and the drain ("$L_{GD}$"). In one particular embodiment, the encapsulation material is applied to the entire area between the gate and the drain on the top surface of the device. However, the high dielectric strength insulating encapsulation material can be located on other areas of the semiconductor device. For instance, encapsulation material can be applied to the entire surface area of the upper, top layer of the device leaving only leads connected to the device uncovered by the encapsulation material.

The specific location of the high dielectric strength insulating encapsulation material can be selectively controlled using any suitable technique. Lithography techniques can be utilized to selectively control the location of the high dielectric strength insulating encapsulation material through the use of a photo-resist coating. In one embodiment, the high dielectric strength insulating encapsulation material can be selectively applied to the device by forming a substantially uniform high dielectric strength insulating encapsulation material on the top surface of the device, lithography, and etching. After forming the encapsulation material, a portion of the encapsulation material can be removed from the top surface of the device through lithography and etching. Generally, a photo-resist coating, composed of three basic elements (a base or resin, a solvent, and a polymer) is applied over the encapsulation material. As is well known in the art, exposing such photo-resist layers to ultra-violet radiation (e.g., wavelengths around 365 nm), enables the polymer properties to be substantially changed and/or altered.

In a general process of applying the photo-resist coating, the device is initially heated to a temperature sufficient to drive off any moisture that may be present on the surface. A liquid or gaseous "adhesion promoter", such as hexamethyldisilazane (HMDS), can then be applied to promote adhesion of the photo-resist coating to the device. The photo-resist coating can be applied by spin-coating on a spinner. As is known in the art, spin-coating involves dispensing a viscous, liquid solution of photoresist onto the substrate, followed by spinning the substrate to produce a substantially uniform photo-resist layer. The spin coating typically runs at 1200 to 4800 rpm for 30 to 60 seconds, and produces a layer between 2.5 and 0.5 micrometres thick. After application of the photo-resist layer, the device can be "soft-baked" or "prebaked" to drive off excess solvent, typically at 90 to 100° C. for 5 to 30 minutes. An oven or a hot-plate can be used.

Then, a mask may be placed over the photo-resist coating overlying the device such that select portions of the photo-resist coating are exposed, while other portions of the photo-resist coating are shielded by the mask. In this embodiment, the masked portions of the device correlate to those portions where the encapsulation material will be located on the final device. After positioning the mask over the device, the mask and device combination is irradiated with an energy source (e.g., ultraviolet light). In its basic form, the "mask" serves to shield at least one area or section of the device from the irradiating energy source and to expose at least one adjacent section to the energy source. For example, the mask may be a generally transparent or translucent blank (e.g., a strip of material) having any pattern of shielded regions printed or otherwise defined thereon. The transparent/translucent, unshielded regions of the mask correspond to the exposed areas of the device member. Alternatively, the mask may simply be an object or objects placed over the device. Regardless of the particular type of mask utilized, it should be understood that any pattern can be utilized to grow the encapsulated material in the desired areas. The energy source may be, for example, a light source, e.g., an ultraviolet (UV) light source, an electron beam, a radiation source, etc. This is a so-called "positive" photo-resist coating, since the energy source irradiates the exposed areas of the photo-resist coating such that these portions can be removed from the device to expose the underlying device in those selected areas. In this positive photo-resist coating, the energy source activates the exposed areas of the photo-resist coating so that these activated areas can be removed. More specifically, the energy source causes a chemical change that allows that portion of the photo-resist layer to be removed by a special solution, referred to as a "developer". In one embodiment, a metal-ion-free developer, such as tetramethylammonium hydroxide (TMAH), can be used to remove the activated portion of the photo-resist layer.

Once the select areas of the photo-resist coating are removed, the underlying encapsulation material is exposed in those select areas. Finally, the device, with the encapsulation material exposed in select areas and with the photo-resist coating overlying the encapsulation material in other areas, is subjected to an etching process to remove the remaining photo-resist coating and to remove the exposed encapsulation material from the device.

Generally, etching can be performed by either of two methods known in the art: (a) dry etching or (b) wet etching. In the dry etching technique, a reactive ion bombardment of chemical species are used to impinge on the surface with high energy. The chemical species can be, for example, fluorine ions from sources such as silicon hexafluoride, carbon tetrafluoride, etc. Due to the collision and chemical reactions, the exposed material is either etched away or sputtered away. The same can be achieved by employing even higher power density of ion species by involving inductively coupled plasma techniques whereby a very high radio-frequency (RF) power source is utilized in conjunction with a reactive ion coil. In the wet etching, a chemical is used to react chemically with the exposed areas to remove the undesired portions. Typically, the chemical is either an acid (e.g., hydrofluoric acid) or a base. After etching, the device is left with the encapsulation material only in the areas corresponding to those shielded from the energy source by the mask. Thus, the areas that were exposed to the energy source have no encapsulation material remaining, leaving the device exposed in those areas.

Alternatively, a lift-off technique can be utilized to have the encapsulation material on select areas of the device. According to this embodiment, a photo-resist coating is first applied over the device. Next, a mask is positioned over the photo-resist coating. However, in this embodiment, the areas of the photo-resist coating exposed by the mask correspond to the areas that will ultimately be coated with the encapsulation material. Likewise, the areas of the photo-resist coating shielded by the mask correspond to those areas that will be free of the encapsulation material. An energy source (e.g., UV light) is applied to the mask and device combination to form activated areas that correspond to those areas to be coated with an encapsulation material.

After exposure to the energy source, the activated areas of the photo-resist coating are removed from the device to leave exposed areas of the device. These exposed areas of the device are the areas that will be encapsulated. Following removal of the activated areas of the photo-resist coating, the encapsulation material (e.g., a dielectric layer) is grown to overly the exposed device and the remaining photo-resist coating. In order to grow the encapsulation material without damaging the remaining photo-resist coating, a DDD process can be utilized because this process can be performed at relatively low temperatures. Other deposition processes require a relatively high deposition temperature which would most likely bake and damage (e.g., crack, remove, carbonize, etc.) the remaining photo-resist coating, probably rendering the photo-resist coating ineffective. For example, the encapsulation material can be applied over the device and remaining photo-resist coating at a temperature of less than about 500° C., such as less than about 300° C., and in some embodiments less than about 150° C.

Finally, an energy source can be applied to the entire device to activate all of the remaining photo-resist coating. Thus, the remaining photo-resist coating positioned between the device and the encapsulation material becomes activated. The activated photo-resist coating and the encapsulation material overlying it can then be removed through the use of a removal solution. As a result, only the encapsulation material that was applied directly to the exposed top surface remains on the device.

For example, a silicon dioxide layer can be grown on the device as an encapsulation material in select areas utilizing a lift-off technique disclosed in PCT Application No. PCT/US 2007/087751 filed 17 Dec. 2007, entitled: "Pulsed Selective Area Lateral Epitaxy for Growth of 1E-Nitride Materials Over Non-Polar and Semi-Polar Substrates", which is incorporated by reference in its entirety.

EXAMPLES

The following studies were conducted to illustrate the present invention and are not intended to limit the scope of the invention.

AlGaN/GaN Fabrication Process Overview:

All the AlGaN/GaN HFET structures used in work were grown on sapphire and SiC substrates by low pressure MOCVD. The device epilayer structure consisted of a 15 nm thick low temperature grown AlN buffer layer, 0.3 µm thick high temperature grown AlN buffer layer, followed by a 1.0~5 µm thick undoped GaN layer which was capped with the $Al_xIn_yGa_{1-x-y}N$ wherein $0 \le x \le 1$, $0 \le y \le 1$ and $0 \le x+y \le 1$ bather layer.

The devices fabrication consisted of the following steps:
1. Standard organic and inorganic cleaning of the GaN/AlGaN on sapphire sample.
2. Following a photolithography step, 1500 Å device MESA's were etched out by Reactive Ion Etching using $Cl_2$/$BCl_3$/Ar gas chemistry. $BCl_3$ encourages the side wall protection species/layer formation during the etching giving the required anisotropy to the etch. The devices are cleaned in aqua regia (3:1 $HCl/H_3NO_4$) solution to take out any BN that forms during the etching following by a HF dip.
3. The ohmic regions are developed and opened up next by a photolithography step. The sample is blank coated with required thickness of ohmic metal stack Ti/Al/Ti/Au by e-beam evaporation after which the metal is lift-off to leave metal in defined ohmic regions. The ohmic metals are not limited to abovesaid metal stack.
4. The sample is annealed in nitrogen overpressure for one minute at 850° C. next in Rapid Thermal Annealing (RTA) furnace. The thickness of the metals chosen for the ohmic contacts and the annealing temperature define the contact resistance achieved.
5. A gate lithography step follows next to open and define gate region of the $Al_xIn_yGa_{1-x-y}N$/GaN HFET device. A blank Ni/Au deposition by e-beam evaporator and subsequent lift-off leaves gate on the AlGaN/GaN region.
6. A Ti/Au film is deposited as the probe metal as the last step of the $Al_xIn_yGa_{1-x-y}N$/GaN HFET fabrication. FIG. 3($a$-$d$) gives $Al_xIn_yGa_{1-x-y}N$/GaN HFET fabrication process flow overview.

Thus, as discussed above, the device fabrication started with mesa etching, Ti/Al/Ti/Au ohmic contact deposition and annealing followed by Ni/Au gate formation. The gate length $L_G=2$ µm and gate-source spacing $L_{GS}=2$ µm were kept constant whereas the gate-drain spacing $L_{GD}$ varied from 2 µm to 20 µm. The gate width was $W_G=100$ µm. The layer sheet resistance $R_{SH}=350$ Ω/sq and the contact resistance $R_C=1$ Ω-mm values were measured using a standard Transmission Line Method (TLM) procedure. The threshold voltage was $V_T=-4.5V$.

Figure 4:
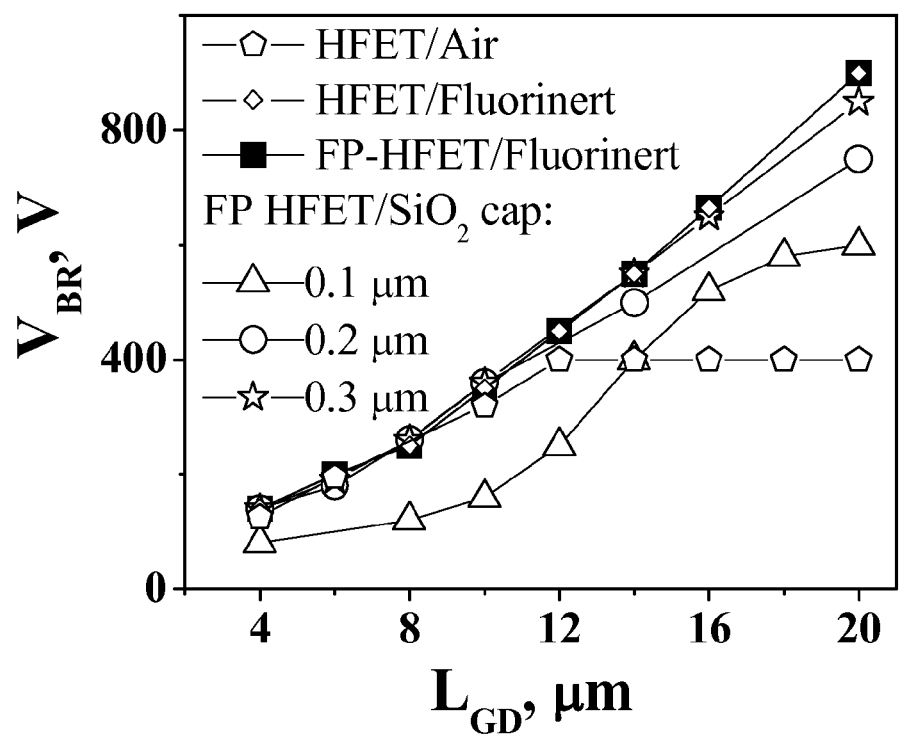
FIG. 4 shows $V_{BR}$-$L_{GD}$ dependence of as-fabricated (AF) and Field-Plated (FP) AlGaN/GaN HFETs in Fluorinert® ambient and encapsulated in varying thickness digital dielectric deposited (DDD) or digital oxide deposited (DOD) $SiO_2$.
Figure 5:
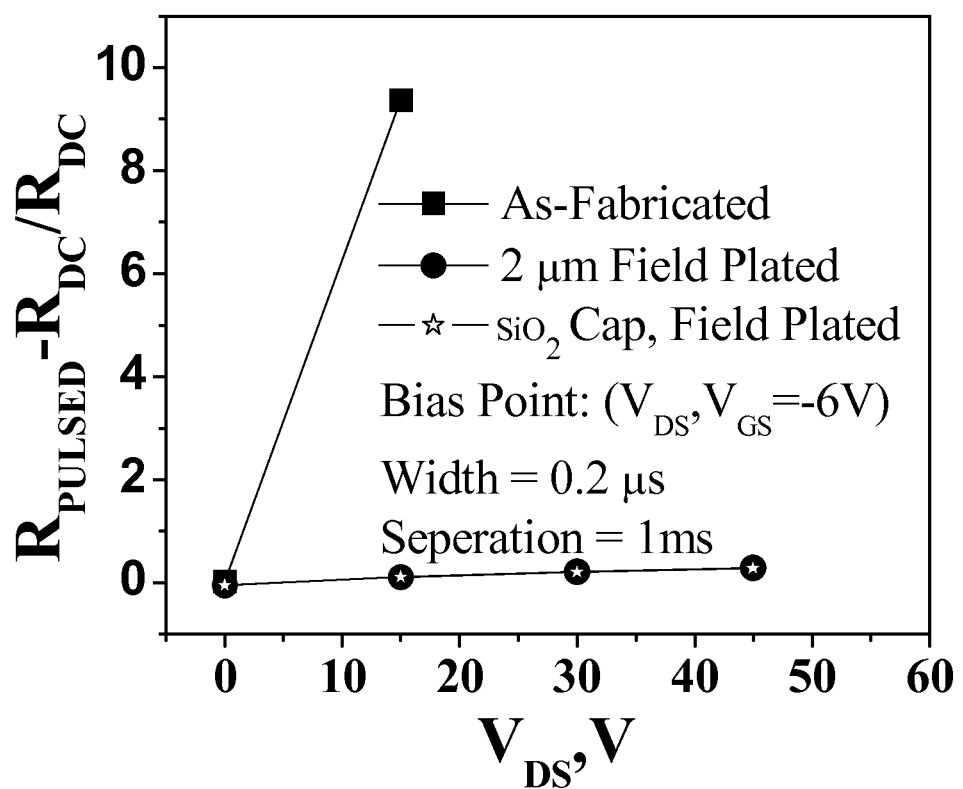
FIG. 5 shows change in ON-resistance in the pulsed mode due to current collapse normalized to the DC ON-resistance for as-fabricated and field plated AlGaN/GaN HFETs.

Parasitic Air Breakdown:

The breakdown voltage measured using the Tektronix 370A curve tracer was defined as the drain voltage at which the drain current exceeds 1 mA/mm with the gate biased below the threshold voltage. The as-fabricated devices were tested for the breakdown voltages in the air and in the Fluorinert® ambience. As shown in FIG. 4, the $V_{BR}$-$L_{GD}$ curve for the Fluorinert® ambience yields a breakdown voltage of about 900 V at $L_{GD}=20$ µm. The corresponding on-resistance is about $R_{ON}=2.43$ mΩ·cm². However, these $R_{ON}$ values correspond to the static device I-V characteristics only. As shown in FIG. 5, the devices without field-plate have the dynamic ON-resistance significantly exceeding the static values and thus are not used for switching applications due to the large-signal dispersion (also referred to as current collapse). The dynamic ON resistance shown in FIG. 5 has been measured by taking the device pulsed current-voltage characteristics immediately after application of 50 V drain voltage pulses. A pulse width of 0.2 µs and a pulse period of 1 ms was used.

To investigate the reasons for the reported saturation in breakdown voltage above 10 µm gate-drain spacing, the AlGaN/GaN HFET test structure sets described below were fabricated. In the first test structure set intended for the study of $V_{BR}$-$L_{GD}$ dependence of AlGaN/GaN HFET, the gate length $L_G=2$ µm and gate-source spacing $L_{GS}=2$ µm were kept constant whereas the gate-drain spacing $L_{GD}$ varied from 2 µm to 20 µm. The gate width was fixed at $W_G=100$ µm.

In the second test structure set intended to study the effect of gate length LG on the breakdown voltage $V_{BR}$, the AlGaN/GaN HFETs gate-source distance $L_{GS}$ was fixed at 2 µm and the gate-drain distance $L_{GD}$ are fixed at 10 µm, while the gate-length was varied from 2 µm to 11 µm.

Figure 6:
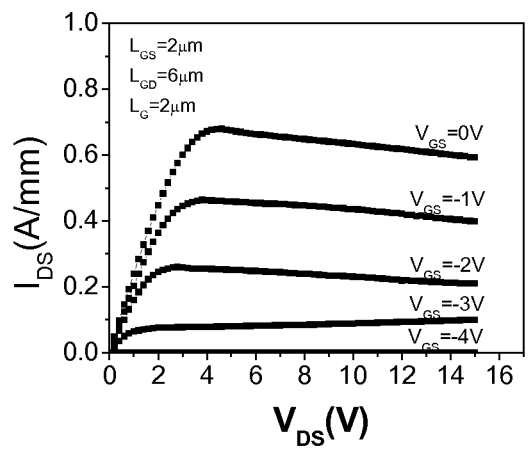
FIG. 6: DC $V_{DS}$-$I_{DS}$ ($V_{GS}$) of the AlGaN/GaN HFET

After fabricating the AlGaN/GaN HFET test structures sets using the above described process flow, the sheet resistance of the 2DEG at the AlGaN/GaN on sapphire and the ohmic contact resistance were calculated as $R_{SH}=350$ Ω/sq and $R_C=1$ Ω-mm using a standard TLM procedure. The threshold voltage was measured to be $V_T=-4.5V$. FIG. 6 gives the typical DC $V_{DS}$-$I_{DS}$ ($V_{GS}$) of the AlGaN/GaN HFET. As seen in FIG. 6, a current density of 0.6 A/mm was achieved on the device. The breakdown voltage of the AlGaN/GaN HFET devices with different dimensions was measured using the Tektronix 370A. The breakdown voltage was defined as the drain voltage at which the drain current reaches 1 mA/mm with the gate biased below the threshold voltage.

The devices with different $L_{GD}$ were first tested in the air ambient. As seen from FIG. 7, the breakdown voltage $V_{BR}$ increased linearly with $L_{GD}$ for $L_{GD} \le 12$ µm and then saturates at $V_{BR}=450$ V.

Figure 8:
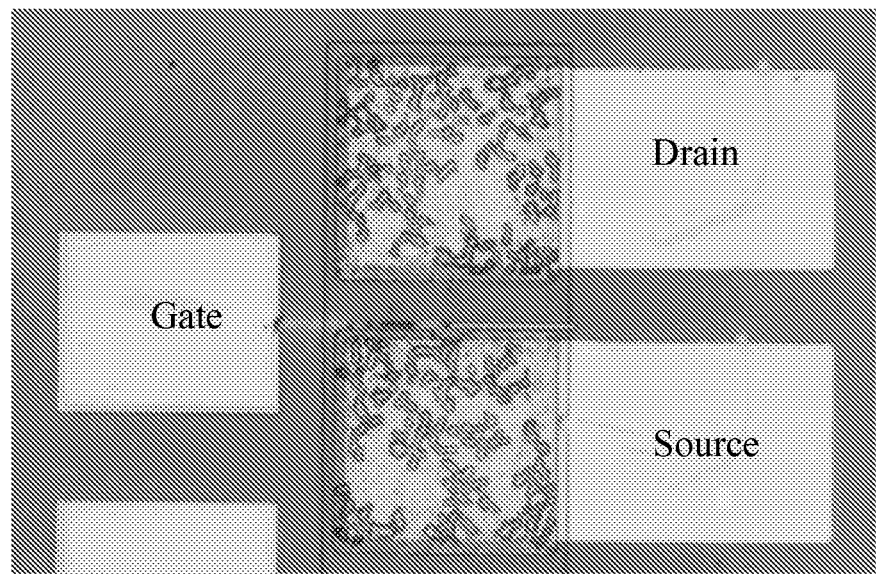
FIG. 8: Optical microscope image of AlGaN/GaN HFET physical breakdown in air showing the evaporated gate metal

An analysis of the devices after breakdown under a microscope to locate where the breakdown was physically taking place revealed that the gate evaporating was the reason for the device failure in all of the cases. There was no physical evidence of any damage to the semiconductor under the gate or in the space between the gate-drain contacts. An optical micrograph of the device after the physical breakdown showing the evaporated gate metal and no sign of damage to the semiconductor as described is given as FIG. 8. These results suggest that the breakdown was premature and resulted from the surface flashover or in other words the breakdown of the air surrounding the device. The surface flashover voltage depends on complex relationships between the insulator (air) surrounding the surface and the surface conditions.

Figure 7:
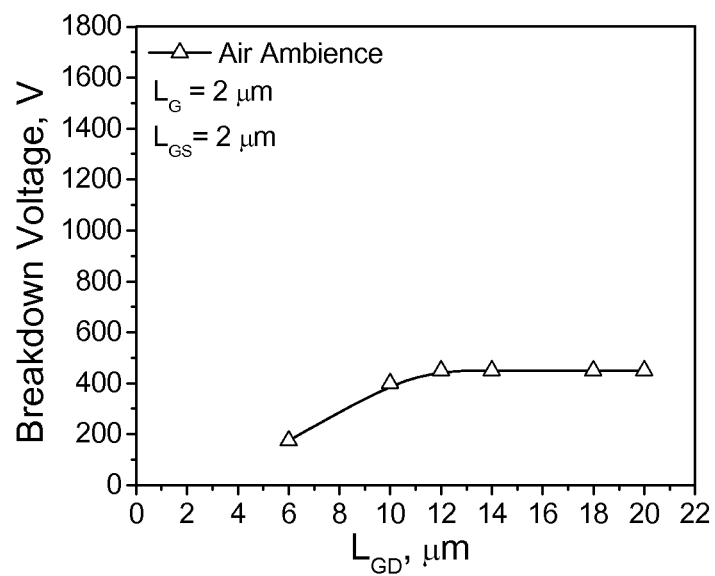
FIG. 7: Measured VBR-LGD curve of AlGaN/GaN HFET in the air ambience
Figure 9:
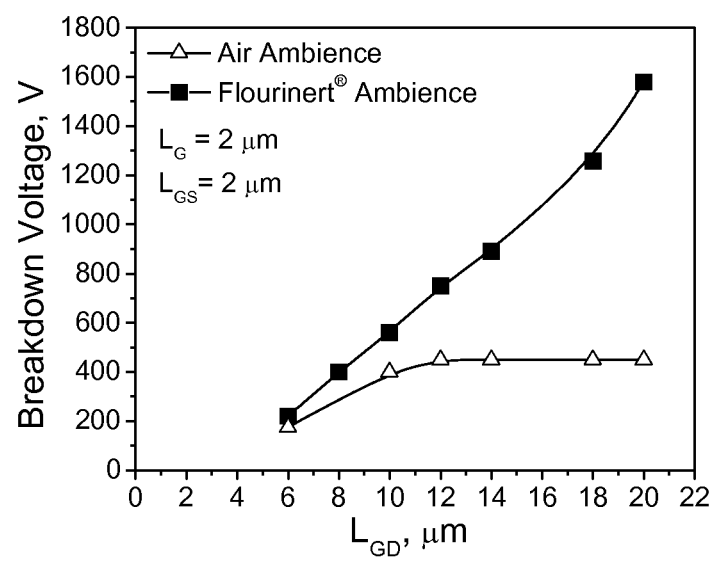
FIG. 9: $L_{GD}$-$V_{BR}$ dependence of the devices measured in air and Flourinert® ambience.
Figure 10:
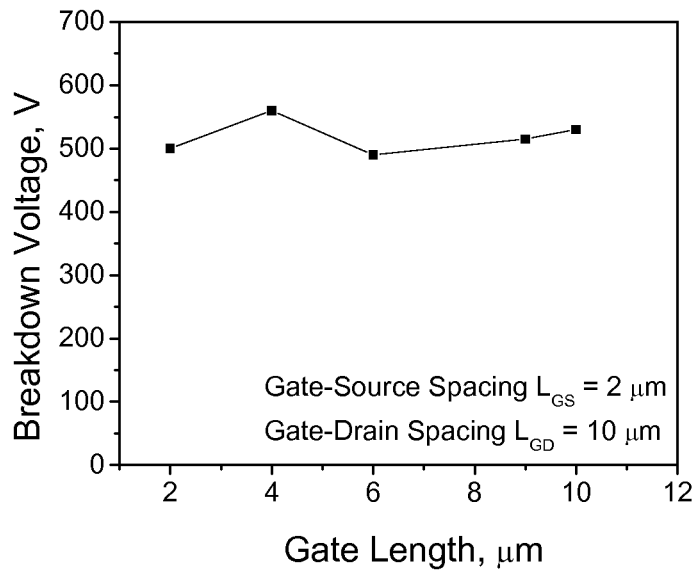
FIG. 10: $V_{BR}$-$L_G$ dependence of the AlGaN/GaN devices measured in air and Flourinert® ambience.

Note the saturation breakdown voltage of around 450V in FIG. 7 is above the Paschen's minimum voltage of 325V for the air breakdown. If the low dielectric strength of air was the reason for the low breakdown voltages in the devices, replacing the air with a high dielectric strength material should result in higher breakdown voltages and linear $V_{BR}$-$L_{GD}$ curve with no saturation. To verify this assertion, the HFETs were measured immersed in the Flourinert® solution. Flourinert® solution (FC-40, marketed by 3M) has a high dielectric strength of 18 MV/m as compared to 3 MV/m for the air. As seen from FIG. 9 (square symbols), with Flourinert® immersion, no $V_{BR}$-$L_{GD}$ dependence saturation was observed even for $L_{GD}$=20 μm where the $V_{BR}$ was 1600V. For this spacing, the measured device static on-resistance was 3.4 mΩ·cm² giving the device figure of merit $V_{BR}^2/R_{ON}$=7.5×10⁸ [V²·Ω⁻¹ cm⁻²]. There was no dependence of the AlGaN/GaN HFET breakdown voltage on the gate length $L_G$ in the Flourinert ambience as shown in FIG. 10.

In order to suppress the current collapse and achieve low dynamic ON-resistance, the devices were subsequently field-plated. First, a 0.1 μm thick $Si_3N_4$ passivation layer was deposited. Next, Ni/Au field plate with the 2 μl overhang toward the drain was deposited on top of the $Si_3N_4$ passivation layer; this was connected to the gate contact pad through an opening in the passivation layer. As shown in FIG. 5, for the field-plated HFETs, the increase in dynamic ON-resistance is minimal, suggesting the mitigation of the current collapse in these devices. The devices were then tested for breakdown voltages in Fluorinert® ambient. As shown in FIG. 4, the measured $V_{BR}$-$L_{GD}$ data of field plated devices were identical to that of the as-fabricated devices yielding a breakdown voltage of around 900V at $L_{GD}$=20 μm in Fluorinert® (solid squares). However, without immersion in Fluorinert®, the breakdown voltage for the FP-HFETs did not exceed 410 V. These results show that although the field plated design allows one to achieve low dynamic ON-resistance, the devices still need to be encapsulated to have high breakdown voltages.

Figure 11:
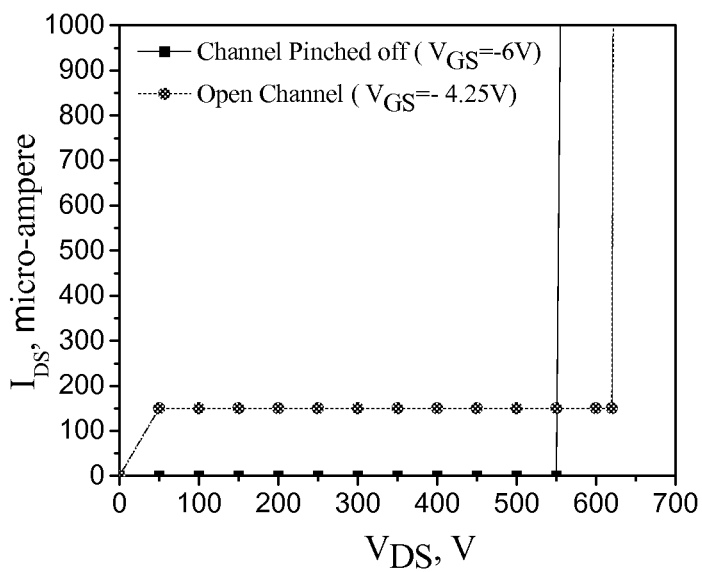
FIG. 11: AlGaN/GaN HFET device IV plot at breakdown with closed channel $V_{GS}$=−6V and partially open channel $V_{GS}$=−4.25V

Breakdown Mechanisms in AlGaN/GaN HFET:

The nature of the device breakdown in the Flourinert® ambient was verified. The breakdown voltages for devices with completely pinched-off ($V_{GS}$=−6V) and partially open ($V_{GS}$=−4.25V) channels were compared. As shown in FIG. 11, for the device with $L_{GD}$=10 μm, a pinched-off channel breakdown voltage was 560 V whereas for $V_{GS}$=−4.25V it had a higher value of 610V. If the breakdown was initiated by an avalanche process in the channel, the breakdown voltage should have decreased. Defect ionization in the buffer may contribute in the breakdown; in this case higher channel concentration at $V_{GS}$>−6V may be screening the electric field in the buffer leading to higher $V_{BR}$. Therefore, even in the Flourinert® the breakdown is still not limited by the 2D channel avalanche. Note the $V_{BR}$-$L_{GD}$ slope in Flourinert® ambient corresponds to a critical field $E_C$~0.8 MV/cm, which exceeds the value of 0.18 MV/cm specified for the Flourinert®; this suggests that the breakdown can still be surface-limited. Hence, further optimization of the surface conditions and buffer quality would lead to high breakdown voltages at even smaller gate-drain spacing.

Solid Encapsulation Materials

Solid encapsulating materials are much more preferable for practical device fabrication and packaging than the liquid Fluorinert®. An ideal encapsulation layer should have the breakdown fields exceeding those of GaN and AlGaN (around 3 MV/cm). Amongst the materials meeting these criteria are the PECVD deposited $Si_3N_4$ (3-12 MV/cm) and $SiO_2$ (3-12 MV/cm). Both materials are candidates for the solid encapsulation of high-voltage III-N HFETs. The higher dielectric constant of silicon nitride ($\epsilon_r$=7.5) as compared to that of silicon dioxide ($\epsilon_r$=3.9) results in higher parasitic capacitances associated with encapsulating layers, thus leading to lower switching frequencies and higher switching loss. SiN layers are also known to significantly increase the gate-drain leakage in AlGaN/GaN HFETs. Therefore, for the presented studies, silicon dioxide films are used as the encapsulation material for AlGaN/GaN HFETs. Other encapsulating materials can include any organic or inorganic, ceramic or polymer material, including but not limited to BCB, AlN, AlGaN, GaN, BN, SiC, diamond, $Al_2O_3$, MgO, HfO, $ZrO_2$, $Sc_2O_3$, Teflon, polystyrene, or bakelite.

One of the key parameters determining the performance of an HFET with solid encapsulation is the required thickness of dielectric cap layer. In order to completely absorb the high-field in the gate-drain region, the thickness of the encapsulating layer should be of the order of $L_{GD}$. However, obtaining the digital dielectric deposited or digital oxide deposited films as thick as 20 μm or so requires long deposition time, results in additional strain and creates significant problems with contact pad openings. In order to estimate the minimal dielectric film thickness required for effective encapsulation, we have carried out 2D-simulations (using the ANSYS software package) of the lateral and transverse electric field distribution between two electrodes with 20 μm spacing laid out on top of GaN ($\epsilon_r$=9) and capped with 25 μm $SiO_2$ ($\epsilon_r$=3.9) film. As seen from FIG. 4, at least 5 μm thick $SiO_2$ encapsulation layer is needed for the peak electric field around the electrodes to drop below the air breakdown field of 0.03 MV/cm for an applied potential of 400V between the electrodes. These simulations suggest that the required $SiO_2$ film thickness to completely suppress the air flashover should be greater than 5 μm for the $L_{GD}$≈20 μm corresponding to the values of $V_{BR}$≈800V.

Large encapsulating layer thickness still creates certain issues in device fabrication; therefore, experimental studies were also conducted of the field-plated AlGaN/GaN HFETs with different thicknesses of encapsulated $SiO_2$ films. At each step, the devices were encapsulated by 0.1 μm thick PECVD deposited $SiO_2$ film. After that, the $V_{BR}$-$L_{GD}$ dependence was measured and the next encapsulation layer was deposited. The results for the field plated devices with different $SiO_2$ cap film thicknesses are compared in FIG. 4. As seen, the 0.1 μm and 0.2 μm thick films were not able to completely suppress the premature breakdown. However, the 0.3 μm thick $SiO_2$ film resulted in almost the same $V_{BR}$-$L_{GD}$ curve as in the Fluorinert® ambience. A consistently high breakdown voltage of about 850-900 V was measured over several 0.3 μm $SiO_2$ encapsulated field plated devices with $L_{GD}$=20 μm in the air ambience. As shown in FIG. 5, the encapsulating $SiO_2$ had no negative effect on the dynamic ON resistance. The devices also showed no change in the leakage current, thereby showing $SiO_2$ encapsulated field plated AlGaN/GaN HFETs to be strong candidates for high voltage, low ON-resistance switches.

Spin-on deposited Bisbenzocyclobutene (BCB) material was also studied for encapsulation. BCB is known as a material with a high dielectric strength of 3-5 MV/cm. BCB has the advantages of low dielectric constant ($\epsilon_r$=2.65−2.5), low moisture intake and easy, fast processing. A 2-3 μm thick cured BCB was found to be effective in suppressing the premature gate-drain breakdown and achieving high breakdown voltages in AlGaN/GaN HFETs, very close to those in the Fluorinert®. BCB film does have some disadvantages, such as poor thermal stability limited by 350° C. BCB is a viable encapsulating material if conditions are manipulated to account for its thermal instability.

Therefore, the suppression of premature breakdown due to surface flashover in AlGaN/GaN HFETs is achieved using digital dielectric deposited or digital dielectric deposited high dielectric strength insulating material encapsulation. It has been found that 0.3 μm thick film can effectively suppress the flashover for 20 μm gate-drain separation resulting in about 900 V, 2.43 mΩ·cm² dynamic ON resistance field-plated AlGaN/GaN HFETs. Similar results have been obtained using 2 μm thick BCB film encapsulation. These results demonstrate a practical design approach to making high voltage III-Nitride switching devices for power converter applications.

These and other modifications and variations to the present invention may be practiced by those of ordinary skill in the art, without departing from the spirit and scope of the present invention, which is more particularly set forth in the appended claims. In addition, it should be understood the aspects of the various embodiments may be interchanged both in whole or in part. Furthermore, those of ordinary skill in the art will appreciate that the foregoing description is by way of example only, and is not intended to limit the invention so further described in the appended claims.

What is claimed:

1. A semiconductor device comprising:
   a substrate;
   a group III nitride semi-insulating buffer layer overlying the substrate, wherein the group III nitride layer comprises $Al_xIn_yGa_{1-x-y}N$, wherein $0 \leq x \leq 1$, $0 \leq y \leq 1$ and $0 < x+y \leq 1$;
   a group III nitride channel layer overlying the buffer layer, wherein the group III nitride layer comprises $Al_xIn_yGa_{1-x-y}N$, wherein $0 \leq x \leq 1$, $0 \leq y \leq 1$ and $0 < x+y \leq 1$;
   a group III nitride barrier layer overlying the channel layer, wherein the group III nitride layer comprises $Al_xIn_yGa_{1-x-y}N$, wherein $0 \leq x \leq 1$, $0 \leq y \leq 1$ and $0 < x+y \leq 1$;
   a drain electrode, a source electrode, and a gate overlying the group III nitride barrier layer;
   a high dielectric strength insulating material deposited over at least a portion of one of the source electrode, the drain electrode or the gate; and
   a multi stack drain field plate formed above said high dielectric strength insulating material, and connected to said drain electrode.

2. The semiconductor device as in claim 1, wherein the high dielectric strength insulating material has a dielectric strength greater than air.

3. The semiconductor device as in claim 1, wherein said high dielectric strength insulating material comprises of the following; silicon dioxide, silicon nitride, benzocyclobutene, aluminium nitride, aluminum galium nitride, galium nitride, boron nitride, silicon carbide, diamond, aluminum oxide, magnesium oxide, hafnium oxide, zirconium oxide, scandium oxide, polytetrafluoroethylene, perfluoroalkoxy, fluorinated ethylene propylene, polystyrene, polyoxybenzylmethylenglycolanhydride, or combinations thereof.

4. The semiconductor device as in claim 1, wherein the high dielectric strength insulating material is deposited on a top surface of the heterostructure field effect transistor between the drain electrode and the gate.

5. The semiconductor device as in claim 1, wherein the high dielectric strength insulating material is deposited on a top surface of the heterostructure field effect transistor between the source electrode and the gate.

6. The semiconductor device as in claim 1, wherein the high dielectric strength insulating material having a dielectric strength greater than 3 MV/m but less than 100 MV/m.

7. The semiconductor device as in claim 1, further comprising:
   a field plate formed above said high dielectric strength insulating material film, and connected to said source electrode or said gate electrode.

8. The semiconductor device as in claim 1, further comprising:
   a drain field plate formed above said high dielectric strength insulating material, and connected to said drain electrode.

9. The semiconductor device as in claim 1, further comprising:
   multi stack field plate formed above said high dielectric strength insulating material film, and connected to said source electrode or said gate electrode.

10. The semiconductor device as in claim 1, wherein the breakdown voltage is between about 300_Y and 100 KV.

* * * * *

UNITED STATES PATENT AND TRADEMARK OFFICE
CERTIFICATE OF CORRECTION

| | | |
|---|---|---|
| PATENT NO. | : 8,692,293 B2 | Page 1 of 1 |
| APPLICATION NO. | : 13/668564 | |
| DATED | : April 8, 2014 | |
| INVENTOR(S) | : Khan et al. | |

It is certified that error appears in the above-identified patent and that said Letters Patent is hereby corrected as shown below:

On the Title Page, Item (72) Inventors: "Naveen Tipimeni" should read --Naveen Tipirneni--.

In the Claims

Column 14, Line 39, Claim 10, "...about 300_Y..." should read --about 300 V--.

Signed and Sealed this
Twenty-first Day of April, 2015

Michelle K. Lee
*Director of the United States Patent and Trademark Office*